United States Patent
Dutta (10) Patent No.: US 8,791,359 B2
(45) Date of Patent: Jul. 29, 2014

(54) HIGH EFFICIENCY PHOTOVOLTAIC CELLS

(75) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 1310 days.

(21) Appl. No.: 11/626,826

(22) Filed: Jan. 24, 2007

(65) Prior Publication Data

US 2007/0175507 A1 Aug. 2, 2007

Related U.S. Application Data

(60) Provisional application No. 60/766,575, filed on Jan. 28, 2006.

(51) Int. Cl.
*H01L 31/04* (2006.01)
*H01L 31/0392* (2006.01)
*H01L 31/18* (2006.01)
*H01L 31/0384* (2006.01)
*H01L 31/0352* (2006.01)

(52) U.S. Cl.
CPC ........ *H01L 31/0384* (2013.01); *H01L 31/0392* (2013.01); *H01L 31/18* (2013.01); *H01L 31/03845* (2013.01); *H01L 31/035209* (2013.01); *Y02E 10/50* (2013.01); *H01L 31/04* (2013.01)
USPC ........... 136/256; 136/255; 136/260; 136/262; 136/252; 438/57; 438/63; 438/86; 438/94; 438/95; 438/98; 257/83; 257/81; 257/94; 257/95; 257/101; 257/102; 257/103; 257/E31.032; 257/E31.039; 257/E31.04

(58) Field of Classification Search
USPC ............ 136/256, 255, 260, 262, 252; 438/57, 438/63, 86, 94, 95, 98; 257/83, 81, 94, 95, 257/101, 102, 103, E31.032, E31.039, 257/E31.04
See application file for complete search history.

(56) References Cited

U.S. PATENT DOCUMENTS

| | | | | |
|---|---|---|---|---|
| 4,140,591 A | * | 2/1979 | Fong et al. ................... | 205/112 |
| 4,379,943 A | * | 4/1983 | Yang et al. .................... | 136/249 |
| 5,264,048 A | * | 11/1993 | Yoshikawa et al. ........... | 136/263 |
| 6,033,928 A | * | 3/2000 | Eriguchi et al. ............... | 438/42 |
| 6,852,920 B2 | * | 2/2005 | Sager et al. ................... | 136/263 |
| 6,878,871 B2 | * | 4/2005 | Scher et al. ................... | 136/252 |
| 7,341,774 B2 | * | 3/2008 | Kalkan et al. ................. | 428/119 |
| 2002/0040728 A1 | * | 4/2002 | Yoshikawa ................... | 136/263 |
| 2002/0130311 A1 | * | 9/2002 | Lieber et al. ..................... | 257/1 |
| 2002/0172820 A1 | * | 11/2002 | Majumdar et al. ............ | 428/357 |
| 2002/0189666 A1 | * | 12/2002 | Forrest et al. ................. | 136/263 |
| 2002/0192441 A1 | * | 12/2002 | Kalkan et al. ................. | 428/209 |
| 2003/0013280 A1 | * | 1/2003 | Yamanaka ..................... | 438/487 |
| 2003/0089899 A1 | * | 5/2003 | Lieber et al. ..................... | 257/9 |
| 2003/0168964 A1 | * | 9/2003 | Chen ............................. | 313/495 |
| 2004/0003839 A1 | * | 1/2004 | Curtin ........................... | 136/250 |
| 2004/0084080 A1 | * | 5/2004 | Sager et al. ................... | 136/263 |
| 2004/0109666 A1 | * | 6/2004 | Kim, II ......................... | 385/147 |
| 2004/0118448 A1 | * | 6/2004 | Scher et al. ................... | 136/252 |

(Continued)

*Primary Examiner* — Golam Mowla (57) ABSTRACT

Novel structures of photovoltaic cells (also called as solar cells) are provided. The cells are based on nanoparticles or nanometer-scaled wires, tubes, and/or rods, which are made of electronic materials covering semiconductors, insulators, and may be metallic in structure. These photovoltaic cells have large power generation capability per unit physical area over the conventional cells. These cells will have enormous applications such as in space, commercial, residential and industrial applications.

22 Claims, 8 Drawing Sheets

(56) References Cited

U.S. PATENT DOCUMENTS

| | | | |
|---|---|---|---|
| 2004/0187918 A1* | 9/2004 | Ikeda et al. | 136/263 |
| 2004/0213727 A1* | 10/2004 | Mauro | 423/447.1 |
| 2005/0126628 A1* | 6/2005 | Scher et al. | 136/263 |
| 2005/0150541 A1* | 7/2005 | Scher et al. | 136/250 |
| 2005/0214967 A1* | 9/2005 | Scher et al. | 438/63 |
| 2006/0032530 A1* | 2/2006 | Afzali-Ardakani et al. | 136/263 |
| 2006/0207647 A1* | 9/2006 | Tsakalakos et al. | 136/256 |
| 2007/0012354 A1* | 1/2007 | Kobayashi et al. | 136/252 |
| 2007/0175507 A1* | 8/2007 | Dutta | 136/255 |
| 2007/0204901 A1* | 9/2007 | Dutta | 136/256 |
| 2007/0204902 A1* | 9/2007 | Dutta | 136/256 |
| 2008/0047604 A1* | 2/2008 | Korevaar et al. | 136/258 |
| 2008/0066802 A1* | 3/2008 | Reddy | 136/258 |

* cited by examiner

HIGH EFFICIENCY PHOTOVOLTAIC CELLS

CROSS REFERENCE TO RELATED APPLICATIONS

This application claims the benefit of U.S. Provisional Application No. 60/766,575 filed Jan. 28, 2006.

FIELD OF INVENTIONS

This patent specification relates to structures of photovoltaic cells (hereafter mentioned also as "solar cells"). More specifically, it relates to photovoltaic cells comprising structures that increase the junction area and absorb a broad solar spectral spectrum in order to increase power generation capability per unit area. This also relates to photovoltaic cells containing nano-scaled blocks. These photovoltaic cells can be used in commercial, residential, and also industrial applications for power generation.

BACKGROUND OF THE INVENTIONS

Photovoltaic cells where light is converted into electric power to be fed to external loads, which are electrically connected to the photovoltaic cells, have been prevailing in a wide range of applications such as consumer electronics, industrial electronics, and space exploration. In consumer electronics, photovoltaic cells that consist of materials such as amorphous silicon are used for a variety of inexpensive and low power applications. Typical conversion efficiency, i.e. the solar cell conversion efficiency, of amorphous silicon based photovoltaic cells is in the range of ~10% [Yamamoto K, Yoshimi M, Suzuki T, Tawada Y, Okamoto T, Nakajima A. *Thin film poly-Si solar cell on glass substrate fabricated at low temperature.* Presented at MRS Spring Meeting, San Francisco, April 1998.]. Although the fabrication processes of amorphous silicon based photovoltaic cells are rather simple and inexpensive, one notable downside of this type of cell is its vulnerability to defect-induced degradation that decreases its conversion efficiency.

In contrast, for more demanding applications such as residential and industrial solar power generation systems, either poly-crystalline or single-crystalline silicon is typically used because there are more stringent requirements of better reliability and higher efficiency than those in consumer electronics. Photovoltaic cells consisting of poly-crystalline and single-crystalline silicon generally offer conversion efficiencies in the range of ~20% and ~25% [Zhao J, Wang A, Green M, Ferrazza F. *Novel 19.8% efficient 'honeycomb' textured multicrystalline and 24.4% monocrystalline silicon solar cell.* Applied Physics Letters 1998; 73: 1991-1993.] respectively. As many concerns associated with a steep increase in the amount of the worldwide energy consumption are raised, further development in industrial solar power generation systems has been recognized as a main focus for an alternative energy source. However, due to the high cost ($3 to $5/Watt) of today's Si-based solar cell, it is not yet widely accepted as an alternative energy source solution.

Group II-VI compound semiconductors, for example CdTe and CdS, have been considered for the purpose of creating industrial solar power generation systems, manufactured at a lower cost and maintaining a moderate conversion efficiency. This approach resulted in a comparable conversion efficiency of ~17% [Wu X, Keane J C, Dhere R G, DeHart C, Duda A, Gessert T A, Asher S, Levi D H, Sheldon P. *16.5%-efficient CdS/CdTe polycrystalline thin-film solar cell. Proceedings of the 17th European Photovoltaic Solar Energy Conference,* Munich, 22-26 Oct. 2001, 995-1000.]. This conversion efficiency is comparable to those for the single crystalline silicon photovoltaic devises; however, the toxic nature of these materials is of great concern for environment.

Group I-III-VI compound semiconductors, such as CuInGaSe$_2$, have also been extensively investigated for industrial solar power generation systems. This material can potentially be synthesized at a much lower cost than its counterpart, single crystalline silicon. However, a conversion efficiency of ~19%, is comparable to that of single crystalline silicon based cells and can be obtained, thus far, only by combining with the group II-VI compound semiconductor cells [Contreras MA, Egaas B, Ramanathan K, Hiltner J, Swartzlander A, Hasoon F, Noufi R. *Progress toward 20% efficiency in Cu(In,Ga)Se polycrystalline thin-film solar cell. Progress in Photovoltaics: Research and Applications* 1999, 7: 311-316.], which again raises issues associated with the toxic nature of these materials.

Photovoltaic cells designed for several exclusive applications, where the main focus is high conversion efficiency, generally consist of group III-V semiconductors, including GaInP and GaAs. In general, synthesis processes of single crystalline group III-V are very costly because of substantial complications involved in epitaxial growth of group III-V single crystalline compound semiconductors. Typical conversion efficiencies of group III-V compound semiconductor based photovoltaic cells, as these types of photovoltaic cells are intended to be, can be as high as ~34% when combined with germanium substrates, another very expensive material [King R R, Fetzer C M, Colter P C, Edmondson K M, Law D C, Stavrides A P, Yoon H, Kinsey G S, Cotal H L, Ermer J H, Sherif R A, Karam N H. *Lattice-matched and metamorphic GaInP/GaInAs/Ge concentrator solar cells. Proceedings of the World Conference on Photovoltaic Energy Conversion* (WCPEC-3), Osaka, May 2003, to be published.], usually more than 10 times as expensive as the conventional Si-solar cell.

Figures 1A, 1B:
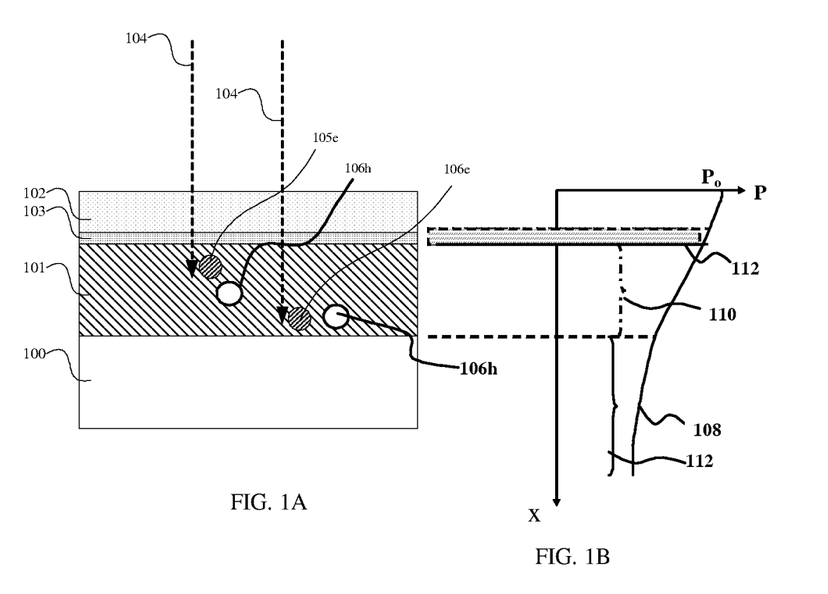
FIG. 1A is the schematic showing the cross-sectional view of a conventional photovoltaic cell structure. This is the explanatory diagram showing the prior-art of today's photovoltaic cell.
FIG. 1B shows the light intensity behavior inside prior-art semiconductor materials.

All photovoltaic cells in the prior art described above, regardless of what materials the cell is made from, essentially fall into one specific type of structure, which usually limits its power generation capability. Usually a flat pn-junction structure is used in conventional solar cells (FIG. 1A). Shown in FIG. 1A is a photovoltaic cell comprising a thick p-type semiconductor layer 101 and a thin n-type semiconductor layer 102 formed on an electrically conductive substrate 100. A pn-junction 103 is formed at the interface between the p-type semiconductor layer 101 and the n-type semiconductor layer 102. Incident light 104 entering the cell generates electron-hole pairs after being absorbed by the p- and also n-type semiconductor layers 101 and 102. The incident light 104 generates electrons 105e and holes 105h in the region near the pn-junction 103 and also electrons 106e and holes 106h in the region far from the pn-junction 103. The photo-generated electrons 105e and 106e (and holes) (hereafter considering only electronics, i.e. minority carriers in p-type semiconductors, although the same explanation is applicable for holes, minority carriers in n-type semiconductors) diffusing toward the pn-junction 103 and entering the pn-junction 103 contribute to photovoltaic effect. The two key factors that substantially impact the conversion efficiency of this type of photovoltaic cell are photo carrier generation efficiency (PCGE) and photo carrier collection efficiency (PCCE).

The PCGE is the percentage of photons entering a cell which contribute to the generation of photo carriers, which needs to be, ideally, 100%. On the other hand, the PCCE is the percentage of photogenerated electrons 105e and 106e that reach the pn-junction 103 and contribute to the generation of photocurrent. For a monochromatic light, a PCGE of ~100% can be achieved by simply making the p-type layer 101 thicker; however, electrons 106e generated at the region far away from the pn-junction 103 cannot be collected efficiently due to many adverse recombination processes that prevent photogenerated carriers from diffusing into the pn-junction 103. Thus, the basic structure of current photovoltaic cells has its own limitation on increasing the conversion efficiency. As the minority carriers travel through the semiconductors, the longer the life-time, the less recombination, which increases the conversion efficiency. Usually, a thicker and higher quality wafer is used to increase the conversion efficiency of the conventional solar cell. However, this makes the solar cell costly and heavier. In addition to increasing the collection efficiency, the absorption of a wide range of the solar spectrum will also increase the conversion efficiency. It is highly desirable to have the solar cell structure in which (a) the increase of the PCCE is independent of the substrate thickness and (b) the ability to absorb a wide range of the solar spectrum is possible.

FIG. 1B shows typical monochromatic light intensity behavior 108 inside the semiconductor. As illustrated in FIG. 1B, the light intensity behavior 108 inside the bulk semiconductor is exponential. The light intensity p at certain depth x can be expressed as $p(x)=P_o \exp(-\alpha x)$, where $P_o$ is the peak intensity at the surface and $\alpha$ is the absorption co-efficient of the semiconductor in which light is entering. Carriers (not shown here) generated due to light flux 112 absorbed by the pn-junction 103 is only drifted by the junction field and can be collected efficiently, whereas, carriers 106e and 106h generated due to absorption of light-flux 110 by semiconductor region 101 are diffused in all directions. Only those carriers 105e and 105h which are generated closer (a distance equal to or less than the diffusion-length of the semiconductor) to the pn-junction 103, can be collected. Those carriers 106e and 106h which are generated far away (a distance longer than the diffusion-length of the semiconductor) from the pn-junction 103 are recombined and lost. The light flux 112 is usually lost either by leaving out or being absorbed by the substrate.

Both PCGE and PCCE are largely dependent on the material and structure of the photovoltaic cells. Today's photovoltaic cells are structured in such a way that (a) wide ranges of the solar spectrum cannot be absorbed due to material limitations, and (b) PCCE is low due to its inherent structure. For example, the typical conversion efficiency of today's crystal-Si based solar cell is ~18%. Wavelengths of the solar spectrum spread from <0.1 µm to 3.5 µm, but Si can only absorb ~0.4 µm to 0.9 µm of light. ~50% of light belonging to the solar spectrum cannot be absorbed by Si, due to its inherent material properties. The remaining 32% is lost due to (i) recombination of photogenerated carriers and (ii) loss of light, which is represented by 112 in FIG. 1B; these two factors are structure dependent. If we could reduce these two factors, ~50% conversion efficiency could be achieved, even in a Si-based solar cell. If we could capture different wavelengths of light belonging to the solar spectrum by utilizing different material systems or nano-material systems, we could increase the conversion efficiency ideally to 100%. Furthermore, if the solar cell (photovoltaic cell) detection capability could be extended to the infrared-spectrum, then the cell could produce electrical energy not only during the day (while sun is present), but also at night (hereafter defined by when the sun is not out). Additionally, today's solar cell material is not highly radiation-tolerant. Specifically, in space applications, photovoltaic cells should be highly radiation tolerant and have structure and material systems which can generate high-power per unit area. In order to increase the conversion efficiency (ideally to 100%), it would be desirable to have photovoltaic cell structures which have (a) larger surface area to volume ratios to capture all the photons (at specific wavelength) entering the cell, (b) a pn-junction that is located as close to the photo absorption region as possible, and (c) photo responses at different spectrums in order to efficiently cover a wide range of spectrums of light that enter a photovoltaic cell. It would be further desirable to have solar cells which could generate electric power in both day and night.

In addition to conversion efficiency, cost-effective manufacturing is another important factor which needs to be taken into consideration. In today's solar cell, the high-cost is one of the main concerns in addition to the issue of achieving low conversion efficiencies. It is found that more than 93% of solar cells are silicon (Si) based, meaning a silicon (Si) wafer is the base material, and the rest are thin-film based solar cells. In manufacturing Si-based solar cells, more than 85% of the cost comes from the Si wafer cost, the remaining comes from other processing costs. It is highly desirable to reduce the wafer cost and at the same time increase the conversion efficiency.

BRIEF SUMMARY OF THE INVENTION

Accordingly, it is an object of the invention to provide structures of photovoltaic cells, which have high power generation capability per unit area, with respect to the conventional counterparts, mentioned as the prior art.

Accordingly, it is an object of this invention to reduce the recombination of carriers and increase the absorption of light, which effectively increases the photogenerated carriers.

Accordingly, it is an object of this invention to increase the absorption bandwidth of the solar spectrum in order to increase the conversion efficiency.

It is an object of this invention to provide solar cell structures based on nano-scaled blocks structures which are formed on the base substrate. The pn- or Schottky junctions are formed with nano-blocks, generating built-in potential by which photogenerated electrons and holes are swept away, leading to photovoltaic effect.

It is an object of this invention to provide solar cell structures based on nano-blocks, such as rods or wires or nanoparticles, formed on the supporting substrate or formed on the electronic materials which are formed on the base substrate. The pn- or Schottky junctions are formed with nano-blocks, generating built-in potential by which photogenerated electrons and holes are swept away, leading to photovoltaic effect.

According to this invention, the supporting substrate can be Si, CdTe, Cu, GaAs, InP, GaN, glass, polymer, ceramics, Ge, C, ZnO, BN, $Al_2O_3$, AlN, Si:Ge, CuInSe, II-VI, III-V, etc.

It is an object of this invention to have electronic materials on which nano-blocks (rods, wires, or tube) or nanoparticles can be formed and said electronic materials can be formed on the base substrate, made from, for example, Si, Ge or glass to lower the cost.

It is an object of this invention to provide structures of photovoltaic cells which can capture most of the wavelengths belonging to the solar spectrum and can provide >80% conversion efficiency.

It is an object of this invention to provide structures of photovoltaic cells which can generate electric power in both day and night.

It is an object of this invention to provide low-cost manufacturing processes for manufacturing the novel photovoltaic cells.

This invention proposes to achieve >60% conversion efficiency utilizing Si— materials and >80% conversion efficiency for other materials. The main advantage of these inventions are that today's matured process technologies allow fabrication of the photovoltaic cell which has power generation capabilities a few orders or more greater than that of conventional photovoltaic cells.

Other objects, features, and advantages of the present invention will be apparent from the accompanying drawings and following detailed description.

BRIEF DESCRIPTION OF THE DRAWINGS

The invention will be explained in more detail in conjunction with the appended drawings wherein.

DETAILED DESCRIPTION

According to the present invention it is our object to provide several photovoltaic cell structures that increase the surface area, which would increase the junction area, and also cover a wide range of the solar spectrum in order to increase conversion efficiency to as high as >60%. Before proceeding to give the detailed explanation of the photovoltaic cell structures and their manufacturing, simulation results are given to show the benefits of increasing the surface area and using the nanoparticles in the photovoltaic cell.

Figure 2A:
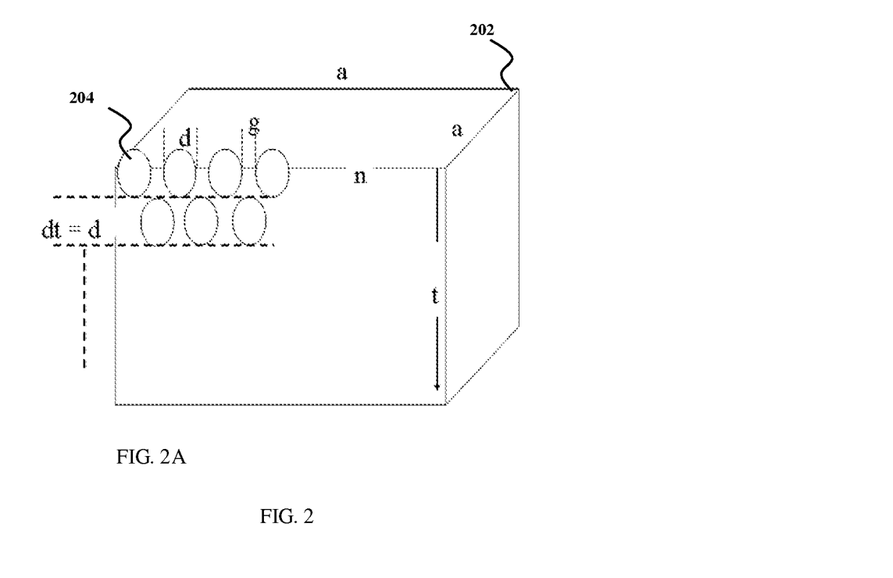
FIG. 2A is the schematic showing the nanoparticle structures which illustrate the benefits of achieving a significantly high ratio of surface area to volume used in the simulation.
Figure 2B:
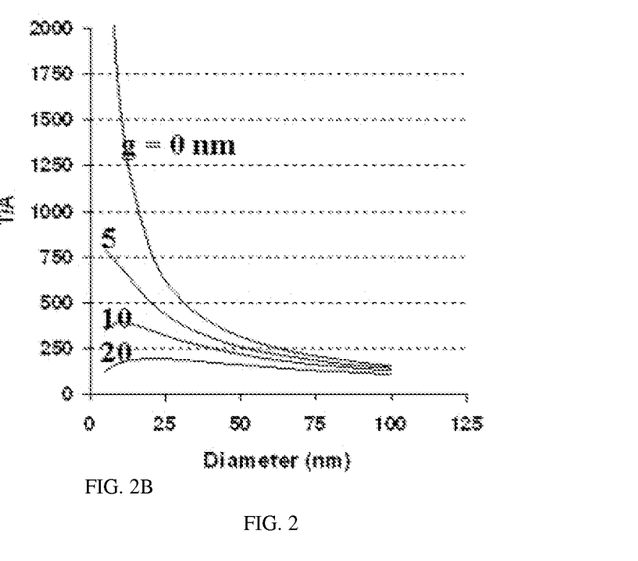
FIG. 2B is the simulation results, showing the ratio of the surface area T to the volume A as a function of diameter of the nanoparticle d with the gap between the particles g as the parameter.

FIGS. 2A and 2B are the schematics representing the layer 202 formed with the nanoparticles. The layer 202 represents the absorption layer in the photovoltaic cell. FIG. 2B shows the simulation results as function of the nanoparticle diameter d with gap g between two nanoparticles as the parameter. In FIG. 2A, n×n number of nanoparticles are arranged in a×a sized layers with thickness t. T/A is the ratio of the surface area of the total nanoparticles T to the volume (a×a×t=A). It is assumed that if we could make the n×n number of nanoparticles 204 on the a×a- area surface. Increase of the ratio indicates the increasing increment of the surface area T in the proposed cell, as compared to the conventional photovoltaic cell, which is usually flat. As depicted in FIG. 2B, by reducing the gap g and the nanoparticle diameter d, the ratio increases significantly. For example, if the particle gap g is kept to 5 nm and the particle diameter d is kept to 5 nm, over 750 times the surface area can be achieved as compared to a conventional 5 cm×5 cm photovoltaic cell.

Figure 3A:
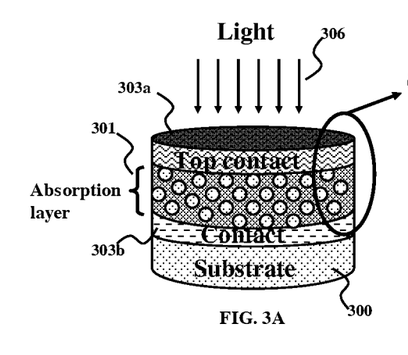
FIGS. 3A and 3B are the schematics showing the cross-sectional views of a photovoltaic cell structure comprising the nanoparticles in the first embodiment, in accordance with the present invention.
Figure 3B:
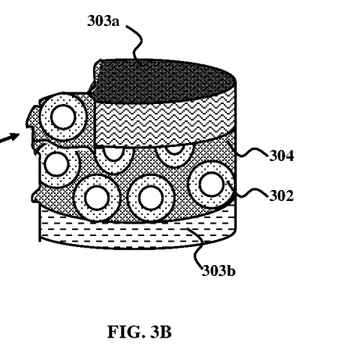

According to the preferred embodiment illustrated in FIGS. 3A and 3B, a photovoltaic cell comprising a nanoparticle based layer 301 acts as the absorption layer, sandwiched by top metal contact 303a and bottom metal contact 303b, formed on the supporting substrate 300. The nanoparticles 302 can be formed as the layer (not shown here) acting as the absorption layer. The nanoparticles 302 can be embedded into the electronic material 304, creating electrical conduction. The electronic material 304 can be semiconductor material or conductive polymer material, which may create the junction (n or p type junction) with the nanoparticles 302. A single or plurality of layers may be require to make the junction (not shown here). The electronic material 304 can be a separate material or electronic materials of p or n type. The electronic material 304 and the supporting substrate 300 are further electrically connected to electrodes 303a and 303b, respectively. The electrodes 303a and 303b are intended to serve as common electrodes which connect all nanoparticles 302. The electrode 303a is provided for the electronic material 304 or junction. The electrode 303a can be transparent (not shown here) and can be formed on the electronic material 304 or junction. The interface between the nanoparticle 302 and the electronic material (or junction) 304 form pn- or Schottky junctions where built-in potential for both electrons and holes is generated. The nanoparticles could be made of any kind of semiconductor material of a few nanometers in size, which could create the quantum confinement effect. Absorption of a broad range of the solar spectrum is possible by utilizing different sizes and different semiconductor nanoparticles. Substrate 300 could be semiconductor, glass, or polymer.

Figure 4A:
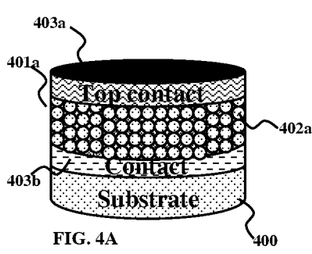
FIGS. 4A, 4B, and 4C are the schematics showing the cross-sectional views of photovoltaic cell structures comprising nanoparticles in the second embodiment, in accordance with the present invention.
Figure 4B:
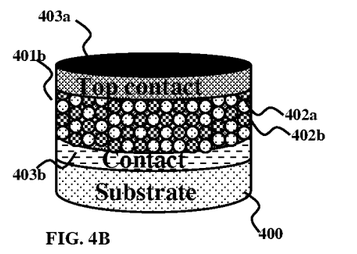
Figure 4C:
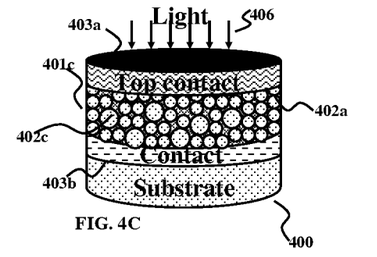

According to this invention, alternatively the nanoparticle based layer 301 can be formed various ways as shown in FIGS. 4A, 4B, and 4C. As shown, the nanoparticle based layer 401 (401a, 401b, and 401c) acting as the absorption layer, can be formed by stacking nanoparticles 402 which are either of same size (402a), different size (402b), or different type (402c). Alternatively, the nanoparticles 402 (402a, 402b, and 402c) can be embedded into the electronic conducting material (not shown here). In way of an example not way of limitation, the nanoparticles 402 can be made of semiconductor material (n-or p-type) and the electric conduction material (not shown here) that is on or surrounds the nanoparticles 402 can be made of p-type semiconductor. Incident light 406 (FIG. 4C) enters the photovoltaic cell through either the electrode 403a or on the material or junction substrate 400. (In FIG. 4C, the incident light 406 enters the photovoltaic cell through the electrode 403a). The incident light 406 travels through the nanoparticle based layer 401, and the substrate 400. The light absorbed by both nanoparticles 402 and the electronic material (not shown here) generates numerous electrons (not shown here). Each nanoparticle 402 helps form the junction all over the surface of the electronic material (not shown here), and helps to collect the carriers without allowing recombination. Utilizing the nanoparticles 402 helps to collect the carriers with less or even no recombination by increasing the junction area. It should be pointed out that electrons are apparently generated all over the region along the thickness of the electric material and the nanoparticles 402. It also should be pointed out that holes are apparently generated all over the region along the thickness of the absorption layer 401.

Unlike a conventional solar cell, the solar cells shown in FIGS. 4A, 4B, and 4C have junctions all over the nanoparticles 402, which create an equivalent to multiple junctions across the thickness of the absorption layer 401. Increasing the thickness would help to absorb photon flux perpendicular to the front contact. As the particle size is nano-scaled, absorption of a broad range of the spectrum can be possible and almost all carriers can be collected, as the junctions are formed a few nanometers apart. It is apparent that utilizing the solar cell shown in FIGS. 3 and 4 can (i) reduce the recombination, (ii) absorb all photo flux, and (iii) cover a broad range of the spectrum, thereby increasing the conversion efficiency.

Figures 5, 5A, 5B:
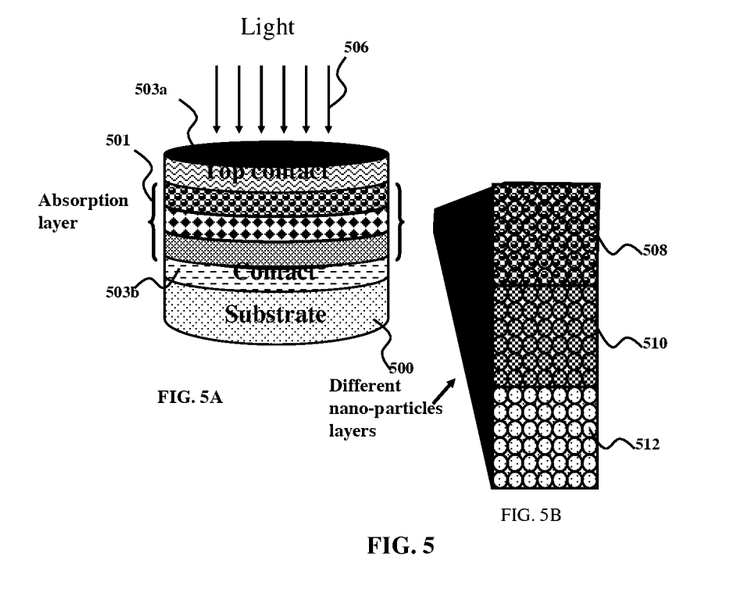
FIGS. 5A and 5B are the schematics showing the cross-sectional views of a photovoltaic cell structures comprising layers of nanoparticles of different sizes and types in the third embodiment, in accordance with the present invention.

According to the preferred embodiment illustrated in FIGS. 5A and 5B, a photovoltaic cell comprising a plurality of absorption layers 501 based on nanoparticles of different types 508, 510, and 512 are formed on the bottom contact 503b which is on the substrate 500. The only difference here, when compared to FIGS. 3 and 4, is that the absorption layer 501 consists of multiple layers of nanoparticles of different type and different sizes 508, 510, 512. Similar to FIGS. 3 and 4, the surface area of the junction for receiving light 506 is also increased which causes a reduction of the photogenerated carrier recombination and the absorption of all photoflux incident on the surface, thereby increasing the conversion efficiency. Note here that by utilizing multiple layers of nanoparticles of different type and sizes, absorption of the full solar spectrum can be possible and, ideally, the conversion efficiency can be increased to 100%.

Apparent advantages of this invention over conventional photovoltaic cells are directly associated with the fact that, unlike conventional photovoltaic cells, multiple discrete junctions are created for collecting all photogenerated carriers created in the absorption layer 501, regardless of where they are generated. According to this invention, recombination can be eliminated (ideally) and all photon flux can be absorbed (ideally), and the conversion efficiency can be ~100% (ideally) and still >50% when using Si. Conventionally, as explained in the description of the prior art shown in FIG. 1, a conventional photovoltaic cell, where electrical-junctions are perpendicular to the direction to which incident light travels, the photogenerated carriers generated in the region far away from electrical-junctions need to diffuse much longer distances (diffusion-length) than those photogenerated carriers generated near the junctions, thus they have a greater chance to recombine without contributing to photovoltaic effects. Therefore, in this invention, PCCE is expected to be much higher than that of conventional photovoltaic cells. In addition, it is evident that the total effective area that contributes to the photovoltaic effect in this invention can be increased significantly by a few orders (>3000) considering a 5 nm diameter with a gap of 0 nm for a 5 cm×5 cm size cell.

According to this invention, in way of an example not way of limitation, the supporting substrate 500 can be ceramics, glass, polymer or any kind of semiconductor on which transparent or nontransparent metal contact 503b is made. Alternatively, supporting substrate 500 can be metal which also acts the metal contact. For this case, copper, stainless steel, Aluminum, or alloyed metal can be used. According to this invention, the nanoparticles 508, 510, 512 can be any kind of semiconductor or compound semiconductors, having absorption capabilities in the desired spectrum region. By utilizing the quantum confinement effect, which is dependent on the size of the nanoparticle, the absorption range can be extended in the blue and red-shift of their parent bulk type materials. For nanoparticles, Si, Ge, InP, GaAs, CdSe, CdS, ZnO, ZnTe, ZnCdTe, CuInSe, CuSe, InGaAs, etc. can be used.

According to this invention, in a way of an example not way of limitation, the nanoparticles 508, 510, 512 can be stacked to form the absorption layer 501. Alternatively, the electronic conduction material can be used to embed the nanoparticles 508, 510, 512. The electrical conduction material can be the sol-gel layer or any conductive polymer. The top metal contact 503a can be transparent or non-transparent metal. Indium-tin-oxide (ITO) can be used as the transparent metal contact. Alternatively, the electrical conduction layer can be formed onto the absorption layer 501 to create the junction.

Figure 6:
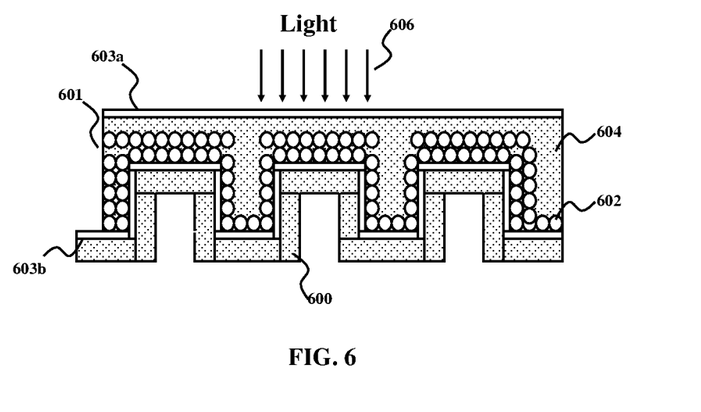
FIG. 6 is the schematic showing the cross-sectional view of a photovoltaic cell structure based on the nanoparticles layer and the cylindrical structure, in the fourth embodiment, in accordance with the present invention.

In an alternative preferred embodiment shown in FIG. 6, a photovoltaic cell comprises a cylindrical-shaped substrate 600, absorption layer 601 based on the nanoparticles 602, electrical conduction layer 604, and top and bottom metal contacts 603a and 603b, respectively. The supporting substrate 600 can be flexible or rigid substrate formed by molding, casting, or etching. The substrate 600 can be polymer, semiconductor or ceramic, or glass type material. Alternatively, supporting substrate 600 can be metal, which can also work as the bottom contact (not shown here). The nanoparticles 602 and the electrical conduction material 604 form the absorption layer 601. The incident beam 606 is absorbed by both the electrical conduction material 604 and the nanoparticles 602, which generate the electrons (and holes), which are in turn collected by the metal contacts 603a and 603b. The junction created by the electrical conduction material 604 and nanoparticles 602 helps sweep away the generated carriers to the contacts 603a and 603b. The electronic material 604 is further electrically connected to electrodes 603a and 603b, which are intended to serve as common electrodes that connect all cylindrical shaped electrical junctions. The electrode 603a is on the electronic material 604. The interface between the nanoparticles 602 and the electronic material 604 form pn- or Schottky junctions, which can be assumed to be multiple discrete junctions inside the conduction material 604.

Photogenerated electrons in the electronic material 604, made of p- and n-type semiconductor or conductive polymer, then diffuse toward the junction created by conduction material 604 and nanoparticles 602. At the junctions, the diffused electrons are swept away by built-in potential, thus photovoltaic effects set in. Common advantages already described for the photovoltaic cells in FIGS. 3, 4, and 5, can be achieved in this embodiment as well. The only differences in FIG. 6 are that the supporting substrate 600 shape is cylindrical and single or multiple layered nanoparticles are used to increase the combined surface to volume ratio significantly.

According to this invention, in way of an example not way of limitation, the supporting substrate 600 can be semiconductors such as Ge, GaAs, GaN, InP, GaN, CdTe, or ZnO or polymer or metal.

Figure 7:
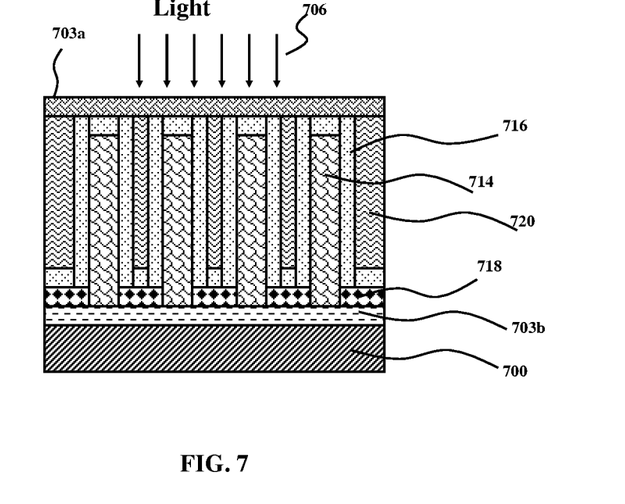
FIG. 7 is the schematic showing the cross-sectional view of a photovoltaic cell structure based on the nano-scaled cylindrical blocks, in the fifth embodiment, in accordance with the present invention.

In the preferred embodiment shown in FIG. 7, a photovoltaic cell comprises a plurality of nanometer(s) scaled cylinders 714 which are electrically connected to a substrate 700. The nano-meter(s) scaled cylinders 714 are surrounded by an electronic material 716, having metallic electrical conduction and forming the junction in the interface of 716 and 714. The electronic material 716 and the supporting substrate 700 are further electrically connected to electrodes 703*a* and 703*b*. The electronic conduction material 716, used to make the junction with nano-meter (s) scaled rods/wires 714, is electrically isolated with the bottom contact 703*b* by dielectric 718. The planarization dielectric (polymer) 720 is on which the metal electrical contact 703*a* is formed. The electrode 703*a* is intended to serve as a common electrode that connects all rods 714. The electrode 703*a* is provided for the electronic material 716. The interface between the nanometer(s)-scale rods 714 and the electronic material 716 form pn- or Schottky junctions, thus there are pn- or Schottky junctions outside of the nanometer(s)-scale rods 714.

Figure 8:
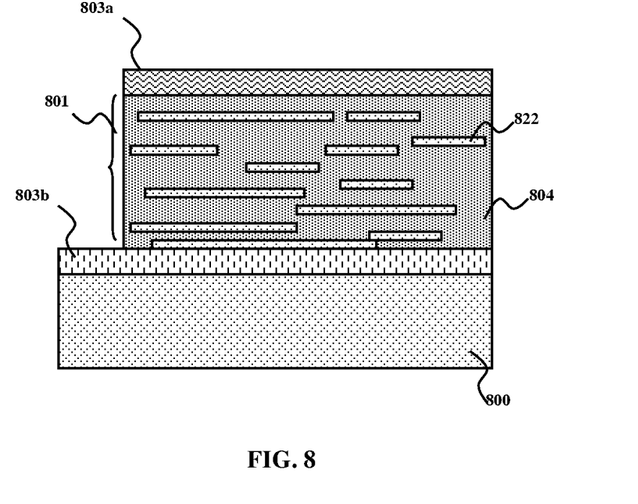
FIG. 8 is the schematic showing the cross-sectional view of a photovoltaic cell structure based on the nano-scaled blocks embedded into the polymer, in the sixth embodiment, in accordance with the present invention.

In an alternative preferred embodiment shown in FIG. 8, a photovoltaic cell comprises a plurality of nanometer(s)-scaled rods (or wires) 822 embedded into the electrical conduction material 804 acting as the absorption layer 801, which is electrically connected to a substrate 800. The micrometer(s) or nanometer(s)-scaled rods (or cylinders) 822 are surrounded by an electronic material 804 having electrical conduction. The electronic material 804 can be a separate material in which nanometer-scaled rods or wires 822 are embedded. The electronic material 804 and the supporting substrate 800 are further electrically connected to electrode 803*a* on the non-substrate side and electrode 803*b* on the substrate side. The interface between the nanometer(s)-scale rods 822 and the electronic material 804 form junctions, thus creating built-in-potential for collecting photogenerated carriers and transferring them to the electrodes. The main difference between the photovoltaic cell shown in FIG. 8 and others of FIGS. 3, 4, 5, and 6, is that the nanometer(s) scaled rods or wires 822 are separately synthesized and are embedded into the electronic material 804 formed on the supporting substrate 800. For example, the nanorods or wires 822 can be semiconductors like, Si, Ge, InP, GaAs, Cds, Cdse, CdTe, ZnO, Znse, ZnS, etc., or combinations thereof, separately synthesized either by epitaxial growth in a vacuum deposition system or chemically formed from the solutions.

According to this invention, in way of an example not way of limitation, the supporting substrate 800 can be Ge, GaAs, GaN, CdTe, ZnO, Cu, Al2O3, AlN, glass, polymer, metal, etc. The electronic material 804 can be conductive polymer or a sol-gel based semiconductor. Note here that use of the nanometer-scaled rods or wires 822 helps not only increase the junction area but also helps transfer the generated carriers to the electrodes 803*a* and 803*b* before recombination. The rods or wires 822 inside the conductive polymer help to transfer the carriers through the rods. By varying the size (diameter) of the nanometer scaled rods (or wires) 822, a quantum confinement effect can be created and thereby absorption of broad spectral ranges can be possible.

Figure 9:
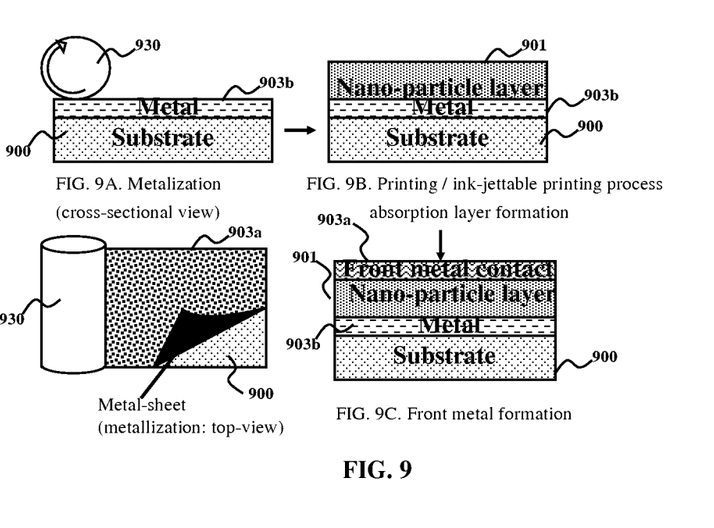
FIGS. 9A, 9B, and 9C are the schematics showing the fabrication process flow for flexible photovoltaic cells comprising a nanoparticle layer as the absorption layer, in the seventh embodiment, in accordance with the present invention.

FIGS. 9A, 9B, and 9C are the schematics showing the fabrication process of the flexible photovoltaic cell based on nanoparticles contained in the absorption layer, according to this invention, wherein the similar numerals in FIGS. 9 represents the similar parts in FIGS. 3, 4, 5, and 6, so that similar explanations are omitted. According to this invention, supporting substrate 900 can be semiconductor such as Si, Ge, GaAs, InP, etc., polymer, or glass. The metal 903*b* acting as the contact in the photovoltaic cells, is formed onto the substrate 900. The metal 903*b* can be pressed and a rolling technique can be used, utilizing the roller 930. To make a firm connection with the substrate, epoxy or glue can be used. The absorption layer 901, comprising the nanoparticles embedding into the conducting polymer, is formed on the metal contact 903*b*. To form the absorption layer 901, spin coating or press and rolling techniques can be used. Alternatively, a printing technique or ink-jettable technique can also be used to form the absorption layer 901. With proper heat treatment, the top contact 903*a* can be formed. It is noted here that the instead of using the substrate 900, alternatively the absorption layer 901 can be directly formed onto the metal 903*b* by using the printing or ink-jettable technique. The advantages of this process are that low-cost and high efficiency flexible photovoltaic cells can be fabricated.

Figure 10:
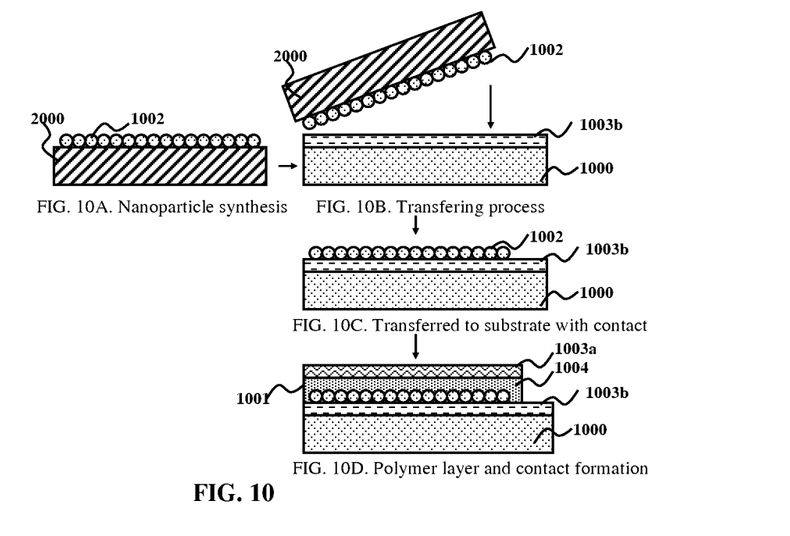
FIGS. 10A, 10B, 10C, and 10D are the schematics showing an alternate fabrication process flow for flexible photovoltaic cells comprising nanoparticles embedded into the polymer layer, in the eighth embodiment, in accordance with the present invention.

FIGS. 10A, 10B, 10C, and 10D are the schematics showing the fabrication process of the photovoltaic cell based on nanoparticles contained in the absorption layer 1001, according to this invention, wherein the similar numerals in FIGS. 10 represent similar parts in FIGS. 3, 4, 5, and 6, so that similar explanations are omitted. According to this invention, a layer of nanoparticles 1002 is formed on the substrate 2000 by chemical synthesis. A thin layer (not shown here) may be required in between substrate 2000 and the nanoparticle 1002, to increase the sticking coefficient. The layer of nanoparticles 1002 then transferred to the foreign substrate 1000 with metal electrode 1003*b*, on which the photovoltaic cell is to be made. The transfer of the nanoparticles 1002 to the foreign substrate 1000, can be done by heat or imprinting treatment. According to this invention, foreign substrate 1000 can be a semiconductor such as Si, Ge, GaAs, InP, etc., polymer, or glass. Alternatively, the layer of nanoparticles 1002 can be directly transferred to the metal which could act as the substrate and also as the contact for the photovoltaic cell. Alternatively, without using the transferring process described in FIGS. 10A and 10B, the nanoparticle 1002 layer can be formed using printing or ink-jettable printing processes. The absorption layer 1001 comprising the nanoparticles 1002 embedding into the conducting polymer 1004 is formed on the metal contact 1003*b*. To form the absorption layer, spin coating or press and rolling techniques, as mentioned earlier, can be used. Alternatively, printing or ink-jettable techniques can also be used to form the absorption layer 1001. After proper heat treatment, the top contact 1003*a* is formed. It is noted here that the instead of using the substrate 1000, alternatively the absorption layer 1001, can be directly formed onto the metal 1003*b*, using printing or ink-jettable techniques. The advantages of this process are that low-cost and high efficiency flexible photovoltaic cells can be fabricated.

Figure 11:
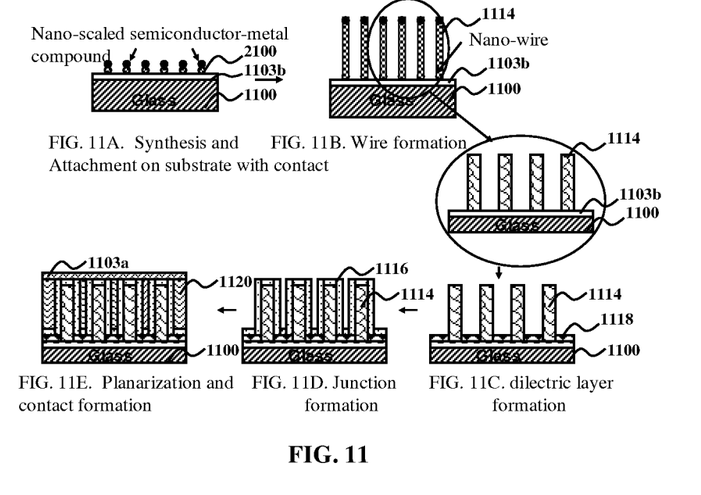
FIGS. 11A, 11B, 11C, 11D, and 11E are the schematics showing an alternate fabrication process flow for photovoltaic cells comprising nano-scaled wires/blocks formed on the dielectric or semiconductor substrate, in the ninth embodiment, in accordance with the present invention.

FIGS. 11A, 11B, 11C, 11D, and 11E are the schematics showing the fabrication process of the photovoltaic cell based on nanoscaled rods or wires 1114 formed on the supporting substrate 1100, according to this invention, wherein the similar numerals in FIGS. 11 represent similar parts in FIG. 7, so that similar explanations are omitted. According to this invention, nano-meter sized metal-semiconductor compounds 2100 are formed on the substrate 1100 with the metal electrode 1103b. The metal-semiconductor compounds can be formed either on the substrate 1100 by chemical synthesis, or transferred to the substrate 1100 by imprinting or heat treatment processes. According to this invention, the metal-semiconductor compounds 2100 have semiconductor and metal attached together. The semiconductor portion is attached to the substrate and the metal portion acts as the catalytic and is on top of the semiconductor. They are periodically organized onto the substrate 1100 with metal contact 1103b by imprinting or lithography processes. With chemical vapor deposition, the nano-scaled rods 1114 are formed. A dielectric layer, such as silicon-oxide or silicon nitride layer 1118, is used to isolate the junction formed by the electronic material 1116 and nano-rods 1114.

To make the pn-junctions of dissimilar type (p or n), electronic material 1116 is used. For example, if the rod-material 1114 is n-type Si, then p-type Si is to be formed as the electronic material 1116. This can be formed by the diffusion of p-dopants into the n-type substrate. The interface of 1114/1116 forms the junction which has the built-in-potential to create the photovoltaic effect on a large surface area. Finally, a passivation or conformal layer of dielectric or polymer 1120 is formed on the electronic material 1116 after proper chemical mechanical processes. The final stage is to make the planarization using insulator layer 1120 and contact 1113a.

Figure 12:
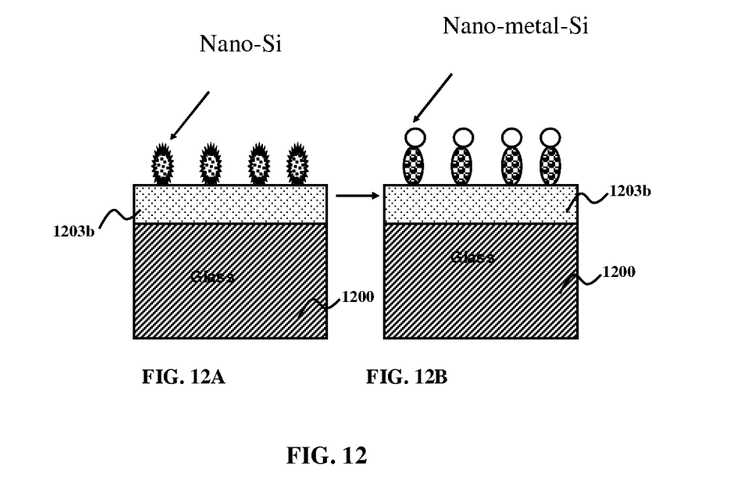
FIGS. 12A and 12B are the schematics showing the formation of the semiconductor-metal nanoparticles, as required by FIG. 11 for fabricating the photovoltaic cell.

FIGS. 12A and 12B are the schematics showing the formation of the semiconductor-metal interface onto the desired substrate 1200, for example glass for fabricating the photovoltaic cell as explained in FIG. 11, according to this invention. Here, the nano-silicon particles are formed uniformly onto the desired substrate 1200 with the metal contact 1203b. Nano-silicon particles made separately by chemical synthesis can be used for this purpose. This is followed by the nano-metal attachment on to the nano-silicon particles, as shown in FIG. 12B. The nanometal onto the nano-silicon acts as the catalytics for forming the nano-rods, as explained in FIG. 11B.

According to this invention, the absorption layer formed by the electronic material and the nanoparticles or nanometer(s) scaled rods, explained in FIGS. 3 thru 11 is a single layer used to form the junctions. By varying the diameter of the nanoparticles or the nano-rods used in the absorption layer, absorption of a wide range of the solar spectrum is possible, which increases the power generation.

According to this invention, as explained in FIGS. 3 thru 11, the nanoparticles or nano-rods are used to increase the junction area, so the junction can be extended closer to the region where the photogenerated carriers are formed. The 3-dimensional structures can be used as part of the electronic material to form the junctions. This structure can be formed utilizing a suitable substrate. The substrate can be used to form the structure where junctions are formed, utilizing the other electronic materials formed on to the 3D structures.

According to this invention, the nanoparticles or rods could be GaN materials (n or p type) and the dozens of materials could be $In_{1-x}Ga_xN$ (p or n type, opposite the GaN rods). By increasing the Ga contents, the band-gap of InGaN can be increased to ~3.4 eV, which is the same as that of GaN. By increasing the In content in InGaN, the band gap can be reduced to ~0.65 eV. Photons with less energy than the band gap will slip right through. For example, red light photons are not absorbed by high-band-gap semiconductors, while photons with an energy higher than the band gap are absorbed, for example, blue light photons in a low-band-gap semiconductor—their excess energy is wasted as heat.

According to this invention, alternatively the nanoparticles or rods could be III-V based materials (n or p type), for example InP, and the dozens of the materials could be III-V based material like $In_{1-x}Ga_xAs$ (p or n type, opposite the InP rods). In this case, by adjusting the In contents, the band gap can be tuned and thereby a wide spectrum of the solar energy can be absorbed.

According to this invention, alternatively the nanoparticles or rods could be II-V based materials (n or p type), for example CdTe, and the dozens of the materials could be II-VI based material like CdZnS (p or n type, opposite the CdTe rods) or Zn(Cd)Te/ZnS based materials. In this case, by adjusting the Zn contents, the band gap can be tuned and thereby a wide spectrum of the solar energy can be absorbed.

According to this invention, alternatively the nanoparticles or rods could be Si or amorphous Silicon materials (n or p type) and the dozens of the materials could be Si: Ge alloy (p or n type, opposite the Si rods). In this case, by adjusting the Ge contents, the band gap can be tuned and thereby a wide spectrum of solar energy can be absorbed.

According to this invention, alternatively the nanoparticles or rods could be Si, InP, or CdTe (n or p type) and dozens of different materials could make the junction with the rods (wires or tubes) and each type of material would have a specific band gap for absorbing a specific range of the solar spectrum. In this way a wide range of the solar spectrum can be absorbed, and by increasing the junction area (due to use of the rods, wires, or tubes), the electrical power generation could be increased tremendously (50 times and beyond).

According to this invention, the nanoparticles or nanometer(s)-scale wires, mentioned in the preferred embodiments, can be any kind of electronic materials, covering semiconductor, insulator, or metal.

According to this invention, the nanometer sized nanoparticles or rods can be made from semiconductors such as Si, Ge, or compound semiconductors from III-V or II-VI groups. As an example for rods, wires, or tubes, InP, GaAs, or GaN III-V compound semiconductors can be used and they can be made using standard growth processes, for example, MOCVD, MBE, or standard epitaxial growth. According to this invention, the self-assembled process can also be used to make wires, rods, or tubes and their related pn-junction in order to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can also cover all kinds of polymers or ceramics such as AlN, Silicon-oxide, etc.

According to this invention, the nanometer sized nanoparticles or rods, based on an II-VI compound semiconductor can also be used. As an example CdTe, CdS, Cdse, ZnS, or ZnSe can be used, and they can be made using standard growth processes, for example, sputtering, evaporation, MOCVD, MBE, or standard epitaxial growth or chemical synthesis. According to this invention, the self-assembled process can also be used to make nanoparticles or wires, and their related pnjunctions to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can also cover all kinds of polymers or ceramics such as AlN, Silicon-oxide, etc.

According to this invention, the nanometer sized rods, wires, or tubes can be made from carbon type materials (semiconductors, insulators, or metal like performances), such as carbon nano-tubes, which could be single or multiple layered. They can be made using standard growth processes, for example, MOCVD, MBE, or standard epitaxial growth. According to this invention, the self-assembled process can also be used to make wires, rods, or tubes and their related pnjunction in order to increase the junction area. These rods, wires, or tubes can be grown on the semiconductors (under same group or others), polymers, or insulators. Alternatively, according to this invention, these rods, wires, or tubes, can be transferred to the foreign substrate or to the layer of foreign material. The foreign substrate or the layer of material can be any semiconductor such as Si, Ge, InP, GaAs, GaN, ZnS, CdTe, CdS, ZnCdTe, HgCdTe, etc. The substrate can also cover all kinds of polymers or ceramics such as AlN, Silicon-oxide, etc.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

Although the invention has been described with respect to specific embodiments for complete and clear disclosure, the appended claims are not to be thus limited but are to be construed as embodying all modification and alternative constructions that may occur to one skilled in the art which fairly fall within the basic teaching here is set forth.

The present invention is expected to be found practically useful in that the novel photo-voltaic cells have higher power generation capability (25 times and beyond) when compared with that of the conventional cells. The proposed invention can be used for fabricating wide solar panels for both commercial and space applications.

What is claimed is:

1. A photovoltaic cell comprising:
    a substrate;
    a first electrode layer disposed on the substrate;
    an absorption layer disposed on the first electrode layer; and
    a second electrode layer disposed on the absorption layer,
        wherein the photovoltaic cell receives light through the second electrode layer, and
        wherein the absorption layer comprises:
            a first layer of continuous electronic material electrically connected to the first electrode layer, wherein the first layer is an n-type semiconductor or a p-type semiconductor,
            a layer of a plurality of nanoparticles disposed upon the first layer and electrically connected to the second electrode layer,
            wherein the nanoparticles are semiconductor of the opposite conductivity type to the first layer, and
            a second layer of continuous electronic material disposed upon the layer of the plurality of nanoparticles and electrically connected to the second electrode layer, wherein the second layer is a semiconductor of the same conductivity type as the first layer.

2. The photovoltaic cell according to claim 1, wherein the nanoparticles are spheres.

3. The photovoltaic cell according to claim 1, wherein the plurality of nanoparticles has nanoparticles of different sizes, thereby widening the range of wavelengths of incident solar radiation that can be absorbed by the absorption layer.

4. The photovoltaic cell according to claim 1, wherein the plurality of nanoparticles are stacked into more than one layer, and each said layer of nanoparticles is selected to absorb incident solar radiation of a different wavelength.

5. The photovoltaic cell according to claim 1, wherein the plurality of nanoparticles has nanoparticles of different semiconductor materials, thereby widening the range of wavelengths of incident solar radiation that can be absorbed by the absorption layer.

6. The photovoltaic cell according to claim 1, wherein the first layer is an n-type semiconductor.

7. The photovoltaic cell according to claim 4, wherein each said layer of nanoparticles has nanoparticles of a different size from the other said layers of nanoparticles.

8. The photovoltaic cell according to claim 4, wherein each said layer of nanoparticles has nanoparticles of a different semiconductor material from the other said layers of.

9. The photovoltaic cell according to claim 1, wherein the nanoparticles are rods, wires, or tubes.

10. The photovoltaic cell according to claim 1, wherein the second electrode layer is a transparent conducting layer.

11. A photovoltaic cell comprising:
    a substrate;
    a first electrode layer disposed on the substrate;
    an absorption layer disposed on the first electrode layer; and
    a second electrode layer disposed on the absorption layer,
        wherein the photovoltaic cell receives light through the second electrode layer, and
        wherein the absorption layer comprises:
            a first layer of continuous electronic material electrically connected to the first electrode layer, wherein the first layer is an n-type semiconductor or a p-type semiconductor,
            a second layer of continuous electronic material electrically connected to the second electrode layer, wherein the second layer is disposed on the first layer, and wherein the second layer is a semiconductor of opposite conductivity type to the first layer, and
            a plurality of nanoparticles fully embedded in the first layer, wherein the nanoparticles are semiconductor of opposite conductivity type to the first layer.

12. The photovoltaic cell according to claim 11, wherein the nanoparticles are spheres.

13. The photovoltaic cell according to claim 11, wherein the plurality of nanoparticles has nanoparticles of different sizes, thereby widening the range of wavelengths of incident solar radiation that can be absorbed by the absorption layer.

14. The photovoltaic cell according to claim 11, wherein the plurality of nanoparticles has nanoparticles of different semiconductor materials, thereby widening the range of wavelengths of incident solar radiation that can be absorbed by the absorption layer.

15. The photovoltaic cell according to claim 11, wherein the nanoparticles are rods, wires, or tubes.

16. The photovoltaic cell according to claim 11, wherein the second electrode layer is a transparent conducting layer.

17. A photovoltaic cell comprising:
    a substrate;
    a first electrode layer disposed on the substrate;

an absorption layer disposed on the first electrode layer; and a second electrode layer disposed on the absorption layer, wherein the photovoltaic cell receives light through the second electrode layer, and wherein the absorption layer comprises:
a layer of continuous electronic material electrically connected to the first electrode, wherein the layer of continuous electronic material is an n-type semiconductor or a p-type semiconductor, and
a plurality of nanoparticles fully embedded in the layer of continuous electronic material.

18. The photovoltaic cell according to claim 17, wherein the plurality of nanoparticles are one selected from the group consisting of spheres, rods, wires and tubes.

19. The photovoltaic cell according to claim 17, wherein the plurality of nanoparticles has nanoparticles of different sizes, thereby widening the range of wavelengths of incident solar radiation that can be absorbed by the absorption layer.

20. The photovoltaic cell according to claim 17, wherein the nanoparticles are semiconductor of opposite conductivity type to the layer of continuous electronic material, thereby creating p-n junctions with the layer of continuous electronic material.

21. The photovoltaic cell according to claim 17, wherein the nanoparticles are semiconductor of the same conductivity type as the layer of electronic material, thereby creating a Schottky junction with the second electrode layer.

22. The photovoltaic cell according to claim 17, wherein the second electrode layer is a transparent conducting layer.

* * * * *